(12) United States Patent
Kang et al.

(10) Patent No.: US 10,229,896 B2
(45) Date of Patent: Mar. 12, 2019

(54) LIGHT EMITTING DIODE APPARATUS AND METHOD FOR MANUFACTURING THE SAME

(71) Applicant: SAMSUNG ELECTRONICS CO., LTD., Suwon-si (KR)

(72) Inventors: Jin-hee Kang, Yongin-si (KR); Ji-hoon Kang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/871,267

(22) Filed: Jan. 15, 2018

(65) Prior Publication Data

US 2019/0006327 A1    Jan. 3, 2019

(30) Foreign Application Priority Data

Jun. 30, 2017  (KR) .................. 10-2017-0083686

(51) Int. Cl.
| | | |
|---|---|---|
| H01L 25/075 | (2006.01) | |
| H01L 33/50 | (2010.01) | |
| H01L 33/62 | (2010.01) | |
| H01L 33/00 | (2010.01) | |
| H01L 33/32 | (2010.01) | |
| H01L 33/60 | (2010.01) | |
| H01L 25/00 | (2006.01) | |

(52) U.S. Cl.
CPC ...... *H01L 25/0753* (2013.01); *H01L 33/0079* (2013.01); *H01L 33/0095* (2013.01); *H01L 33/32* (2013.01); *H01L 33/502* (2013.01); *H01L 33/507* (2013.01); *H01L 33/60* (2013.01); *H01L 33/62* (2013.01); *H01L 25/50* (2013.01)

(58) Field of Classification Search
CPC ..................... H01L 25/0753; H01L 33/62
See application file for complete search history.

(56) References Cited

U.S. PATENT DOCUMENTS

| | | |
|---|---|---|
| 8,963,168 B1 | 2/2015 | Rettke |
| 9,219,197 B1 | 12/2015 | Chen et al. |
| 9,620,695 B2 | 4/2017 | Hu et al. |
| (Continued) | | |

FOREIGN PATENT DOCUMENTS

| | | |
|---|---|---|
| KR | 10-2016-0018706 A | 2/2016 |
| WO | 2016/079505 A1 | 5/2016 |

OTHER PUBLICATIONS

Search Report dated Aug. 30, 2018 issued by the International Searching Authority in Counterpart Application No. PCT/KR2018/005870 (PCT/ISA/210).

(Continued)

*Primary Examiner* — Bryan R Junge
(74) *Attorney, Agent, or Firm* — Sughrue Mion, PLLC

(57) ABSTRACT

A method for manufacturing a light emitting diode (LED) apparatus is provided. The method includes forming a plurality of color filters on a glass layer, forming a plurality of light leakage preventing films on the glass layer in a space between the plurality of color filters; forming a plurality of conductive materials on a surface of each of the plurality of light leakage preventing films opposite to the glass layer; and bonding a plurality of light emitting diodes with the plurality of conductive materials to correspond to the plurality of color filters, respectively.

20 Claims, 10 Drawing Sheets

(56) References Cited

U.S. PATENT DOCUMENTS

| | | | |
|---|---|---|---|
| 10,096,586 B2 * | 10/2018 | Kim et al. | ............. H01L 25/50 |
| 2005/0224813 A1 | 10/2005 | Liu et al. | |
| 2015/0021634 A1 * | 1/2015 | Ishihara | ............. H01L 25/0753 |
| | | | 257/88 |
| 2015/0137163 A1 | 5/2015 | Harris | |
| 2015/0171372 A1 | 6/2015 | Iwata et al. | |
| 2015/0228865 A1 * | 8/2015 | Rhee | .................... H01L 27/156 |
| | | | 257/90 |
| 2015/0249069 A1 | 9/2015 | Yoshida et al. | |
| 2015/0331285 A1 | 11/2015 | Bibl et al. | |
| 2015/0362165 A1 * | 12/2015 | Chu | .................... H01L 25/0753 |
| | | | 362/235 |
| 2016/0126224 A1 | 5/2016 | Lee et al. | |
| 2016/0351620 A1 * | 12/2016 | Tanaka | .................... H01L 33/50 |
| 2017/0025399 A1 * | 1/2017 | Takeya | .................. H01L 33/58 |
| 2017/0336690 A1 * | 11/2017 | Lee | .................... H01L 25/0753 |
| 2018/0122786 A1 * | 5/2018 | Wu | .................... H01L 27/1248 |

OTHER PUBLICATIONS

Written Opinion dated Aug. 30, 2018 issued by the International Searching Authority in Counterpart Application No. PCT/KR2018/005870 (PCT/ISA/237).

* cited by examiner

LIGHT EMITTING DIODE APPARATUS AND METHOD FOR MANUFACTURING THE SAME

CROSS-REFERENCE TO RELATED APPLICATION

This application claims priority from Korean Patent Application No. 10-2017-0083686, filed on Jun. 30, 2017 in the Korean Intellectual Property Office, the disclosure of which is incorporated herein by reference in its entirety.

BACKGROUND

1. Field

Apparatuses and methods consistent with example embodiments relate to a light emitting diode (LED) apparatus and a method for manufacturing the same, and more particularly, to an LED apparatus which may emit red, green, and blue light, and may be used as a pixel, and a manufacturing method thereof.

2. Description of Related Art

Generally in display devices using light emitting diodes (LEDs), three LEDs consisting of red (R), green (G) and blue (B) LEDs, respectively, are used to constitute one pixel. The three LEDs may be manufactured in different ways. Since three LED elements must be separately formed and integrated into one, there may be various related processes, and a relatively large number of deviations in color gamut and luminous efficiency due to different process conditions, temperature, and environment may be caused.

Display device technology for realizing red, green, and blue colors may also include combining a monochromatic LED element and a color conversion element. Specifically, the red and green LEDs may be coated on the blue LED by applying a fluorescent body corresponding to the red and green LEDs through a method such as printing or dispensing. In this case, since the thickness of the fluorescent body, for example, phosphor is not uniform, the wavelength of the emitted light may not be uniform, and since the fluorescent body is applied to each sub-pixel, the manufacturing process time may increase.

In addition, when the fluorescent body and the color filter are applied on the LED by a method such as printing or dispensing, the area of the fluorescent body and the color filter may be wider than the area of the LED, which may make it more difficult to implement a high resolution display.

Accordingly, a manufacturing method which to increase the resolution of the display while uniformly maintaining the wavelength of emitted light is needed.

SUMMARY

One or more exemplary embodiments provide an LED device which emits red, green, and blue light and has a structure in which the uniformity of the wavelength of emitted light and the manufacturing process are improved, and a manufacturing method thereof.

According to an aspect of an example embodiment, there is provided a method for manufacturing a light emitting diode (LED) apparatus, the method including: forming a plurality of color filters on a glass layer; forming a plurality of light leakage preventing films on the glass layer in a space between the plurality of color filters; forming a plurality of conductive materials on a side of each of the plurality of light leakage preventing films opposite to the glass layer; and bonding a plurality of light emitting diodes with the plurality of conductive materials to correspond to the plurality of color filters, respectively.

The forming the plurality of light leakage preventing films may include: forming the plurality of light leakage preventing films on the glass layer; etching the plurality of light leakage preventing films to a first height; and etching a remaining area, excluding a predetermined area of the plurality of light leakage preventing films, to a second height shorter than the first height and forming the plurality of light leakage preventing films to have a shape in which the predetermined area is protruded upward, and wherein the forming the plurality of conductive materials on each of the plurality of light leakage preventing films may include: forming the plurality of conductive materials on a surface of an area protruded from the plurality of light leakage preventing films and a surface of an area within a non-protruded area; and forming a plurality of conductive bonding members on each of the plurality of conductive materials.

The bonding the plurality of light emitting diodes with the plurality of conductive materials to correspond to the plurality of color filters, respectively, may include: bonding a first plate of the LED apparatus including the plurality of light emitting diodes including electrodes with a second plate of the LED apparatus including the glass layer, wherein the electrodes in each of the plurality of light emitting diodes are opposite to the plurality of conductive materials.

The bonding the plurality of light emitting diodes with the plurality of conductive materials to correspond to the plurality of color filters, respectively, may include: bonding electrodes in each of the plurality of light emitting diodes to be in contact with the plurality of conductive materials, respectively, wherein the method further may include: after bonding the electrodes and the plurality of conductive materials, forming a cathode electrode on a surface of each of the plurality of light emitting diodes opposite to the electrodes; and forming a substrate including a switching thin film transistor (TFT) on the cathode electrode, and wherein the electrodes in each of the plurality of light emitting diodes is an anode electrode.

The method further may include: forming a plurality of fluorescent bodies on at least two color filters from among the plurality of color filters, wherein the forming the plurality of light leakage preventing films may include forming the first height to be equal to or higher than a height of the plurality of fluorescent bodies, and the second height to be shorter than the height of the plurality of fluorescent bodies.

The method, wherein each of the plurality of light emitting diodes is divided into a first area and a second area that is thicker than the first area, wherein the first area and the second area include an electrode, respectively, and wherein the bonding the plurality of light emitting diodes with the plurality of conductive materials to correspond to the plurality of color filters, respectively, may include bonding an electrode in the first area with a bonding member formed on the area protruded from the plurality of light leakage preventing films.

The bonding the plurality of light emitting diodes with the plurality of conductive materials to correspond to the plurality of color filters, respectively, may include: filling an empty space between the plurality of color filters, the plurality of light leakage preventing films, and the glass layer with resin; and bonding the plurality of light emitting diodes with the plurality of conductive materials.

The method may further include: after bonding the plurality of light emitting diodes with the plurality of conductive materials, disposing a support substrate on a side of the plurality of light emitting diodes opposite to the plurality of the conductive materials.

The method may further include: forming a plurality of fluorescent bodies on at least two color filters from among the plurality of color filters, wherein an area of each of the plurality of fluorescent bodies is equal to an area of each of the plurality of color filters corresponding to each of the plurality of fluorescent bodies, and wherein an area of each of the plurality of light emitting diodes is larger than an area of each of the plurality of color filters corresponding to each of the plurality of light emitting diodes.

The method, wherein each of the plurality of light emitting diodes include a switching thin film transistor (TFT).

According to another aspect of an example embodiment, there is provided a light emitting diode (LED) apparatus including: a glass layer; a red (R) color filter, a green (G) color filter, and blue (B) color filter which are formed on the glass layer; a plurality of light leakage preventing films formed on the glass layer, the plurality of light leakage preventing films including a protruded area between the R, G, and B color filters; a plurality of conductive materials formed on a surface the plurality of light leakage preventing films opposite to the glass layer; and a plurality of light emitting diodes which are bonded with the plurality of conductive materials on an opposite side of the plurality of light leakage preventing films, the plurality of light emitting diodes being formed to correspond to the R, G and B color filters.

The plurality of conductive materials may include: a plurality metals configured to receive power; and a plurality of bonding members are formed on each of the plurality of metals.

The LED apparatus, wherein each of the plurality of light emitting diodes may include a plurality of electrodes, and wherein the plurality of electrodes may be bonded with the plurality of bonding members.

The LED apparatus may further include: a plurality of cathode electrodes formed on a surface of each of the plurality of light emitting diodes opposite to the plurality of electrodes; and a plurality of substrates which may include a switching thin film transistor (TFT) formed on the plurality of cathode electrodes, respectively, wherein each of the plurality of electrodes in each of the plurality of light emitting diodes may be an anode electrode.

The LED apparatus may further include a plurality of fluorescent bodies which are formed on the plurality of light emitting diodes corresponding to the R and G color filters, wherein a height of the protruded area of each of the plurality of light leakage preventing films may be equal to or longer than a height of the plurality of fluorescent bodies, and a height of a surface of a non-protruded area of the plurality of light leakage preventing films may be shorter than the height of the plurality of fluorescent bodies.

The LED apparatus, wherein each of the plurality of light emitting diodes may be divided into a first area and a second area that is thicker than the first area, wherein each of the first area and the second area may include an electrode, and wherein an electrode provided in the first area may be bonded with a bonding member formed in the protruded area of each of the plurality of light leakage preventing films.

The LED apparatus may further include at least one from among: a resin filled in an empty space formed between the plurality of light leakage preventing films, and the glass layer including the plurality of conductive materials, and a support substrate formed on the plurality of light emitting diodes on an opposite side of the plurality of conductive materials.

The LED apparatus may further include a plurality of fluorescent bodies formed on light emitting diodes corresponding to the R color filter and the G color filter, wherein an area of a fluorescent body may be equal to an area of a color filter corresponding to the fluorescent body from among the R, G, and B color filters, and wherein an area of each of the plurality of light emitting diodes may be larger than an area of each of the R, G, and B color filters corresponding to each of the plurality of light emitting diodes.

The LED apparatus, wherein each of the plurality of light emitting diodes may include a switching thin film transistor (TFT).

The LED apparatus may further include a plurality of fluorescent bodies formed on light emitting diodes corresponding to the R color filter and the G color filter, wherein each of the plurality of fluorescent bodies may be configured to convert light emitted from each of the plurality of light emitting diodes into a wavelength of a sub pixel corresponding to the plurality of light emitting diodes, to diffuse the light converted by a diffusing agent, and to emit the light converted.

BRIEF DESCRIPTION OF THE DRAWINGS

The above and/or other aspects will become more apparent and more readily appreciated from the following description of the example embodiments, taken in conjunction with the accompanying drawings, in which.

DETAILED DESCRIPTION

Hereinafter, example embodiments will be described in detail with reference to the accompanying drawings. These example embodiments are described in sufficient detail to enable those skilled in the art to practice the inventive concept, and it is to be understood that the example embodiments are not intended to limit the present disclosure to particular modes of practice, and it is to be appreciated that all modification, equivalents, and alternatives that do not depart from the spirit and technical scope of the present disclosure are encompassed in the present disclosure.

The terms used in the present specification are used for the purpose of describing the example embodiments, and not for the purpose of limiting and/or restricting the present disclosure.

It is to be understood that the singular forms "a," "an," and "the" include plural referents unless the context clearly dictates otherwise. It will be understood that when the terms "includes," "comprises," "including," and/or "comprising," when used in this specification, specify the presence of stated features, figures, operations, components, or combination thereof, but do not preclude the presence or addition of one or more other features, figures, steps, components, members, or combinations thereof.

The expression, "at least one from among a and b," should be understood as including only a, only b, or both a and b.

Also, terms such as "upper" and "lower," and the like, which are used in the following description are defined based on example embodiments as shown in the respective drawings, but a position of each component is not limited thereto.

Figure 1:
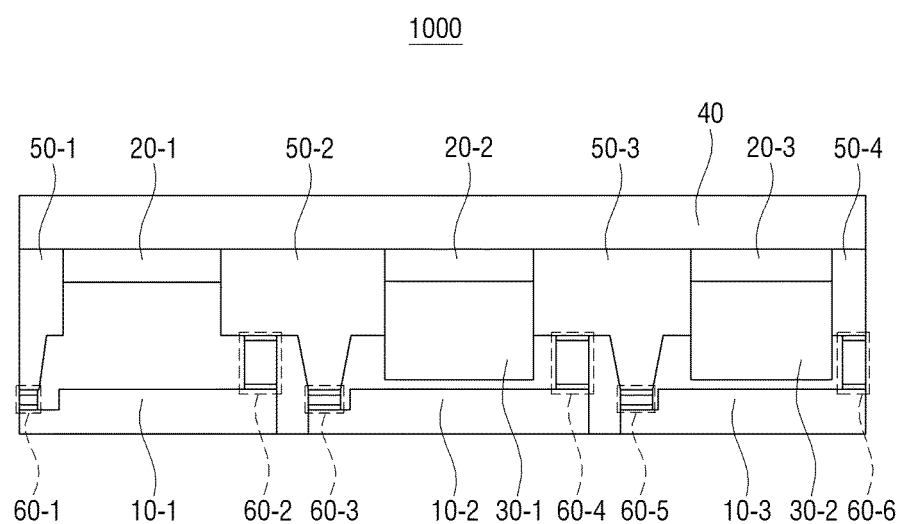
FIG. 1 is a diagram illustrating a light emitting diode (LED) apparatus, according to an example embodiment.

FIG. 1 is a diagram illustrating a light emitting diode (LED) apparatus 1000, according to an example embodiment. Referring to FIG. 1, the LED apparatus 1000 may include a plurality of LEDs 10-1, 10-2, and 10-3, a plurality of color filters 20-1, 20-2, and 20-3, a plurality of fluorescent substances 30-1 and 30-2, a glass layer 40, a plurality of light leakage preventing films 50-1, 50-2, 50-3, and 50-4, and a plurality of conductive materials 60-1, 60-2, 60-3, 60-4, 60-5, and 60-6.

The plurality of LEDs 10-1, 10-2, and 10-3 may be disposed on the corresponding plurality of color filters 20-1, 20-2, and 20-3, respectively, and form a plurality of sub pixels. One pixel may include three sub pixels, but the example embodiments are not limited thereto.

FIG. 1 illustrates an example embodiment of the LED apparatus 1000 which includes one pixel including a red (R) sub pixel, a green (G) sub pixel, and a blue (B) sub pixel. However, example embodiments are not limited thereto, and the LED apparatus 1000 may be a display panel including a plurality of pixels. In this case, FIG. 1 may, for example, illustrate an enlarged view of only a portion corresponding to one pixel of the entire LED apparatus 1000.

According to an example embodiment, the plurality of LEDs 10-1, 10-2, and 10-3 may be formed by depositing a semiconductor material on a substrate and dividing the deposited semiconductor material into a plurality of semiconductor materials. For example, the plurality of LEDs 10-1, 10-2 and 10-3 may be formed by depositing a nitride layer having a hexagonal crystal system on a sapphire substrate, then removing the sapphire substrate, and dividing the nitride layer into a plurality of nitride layers. However, the example embodiments are not limited thereto, and, for example, a silicon substrate may be used instead of a sapphire substrate. In particular, if the plurality of LEDs 10-1, 10-2, and 10-3 emit light of the same color, the example embodiment may be applied regardless of the manufacturing method.

Each of the plurality of LEDs 10-1, 10-2, and 10-3 may be a p-n junction diode that emits light by recombination of excess electron-hole pair. When a voltage is applied in a forward direction to each of the plurality of LEDs 10-1, 10-2, and 10-3, electrons in the n-type semiconductor layer may meet with the holes of the p-type semiconductor layer and may be recombined to emit light.

The plurality of LEDs 10-1, 10-2, and 10-3 may emit light of the same color. When a voltage is applied to the plurality of LEDs 10-1, 10-2, and 10-3, the emitted light may pass through a color filter corresponding to each of the plurality of LEDs and may be converted to light of the wavelength corresponding to the color filter. However, the example embodiments are not limited thereto, and the emitted light may pass through a fluorescent body and a color filter corresponding to the plurality of LEDs and may be converted to light of the wavelength corresponding to the fluorescent body and the color filter. According to an example embodiment, the fluorescent body may be selectively included in the LED apparatus 1000. For example, all of the plurality of LEDs 10-1, 10-2, and 10-3 may emit blue light, and the blue light emitted from some LEDs, for example, 10-2 and 10-3 may pass through the corresponding fluorescent body and color filter and may be converted into green light and red light, respectively. That is, each of the plurality of LEDs 10-1, 10-2 and 10-3 may be included in a plurality of sub pixels that are included in one pixel.

However, the example embodiments are not limited thereto, and the plurality of LEDs 10-1, 10-2, and 10-3 may emit different color light. The type of the plurality of fluorescent bodies 30-1 and 30-2 may vary according to the color of light emitted by the plurality of LEDs 10-1, 10-2, and 10-3.

According to an example embodiment, an area of each of the plurality of LEDs 10-1, 10-2, and 10-3 may be larger than an area of the corresponding color filter and fluorescent body. That is, an area of a fluorescent body and a color filter that pass light may be smaller than an area of an LED that emit light, and thus, by reducing the area of the fluorescent body and color filter, the size of a sub pixel may become smaller.

Each of the plurality of LEDs 10-1, 10-2, and 10-3 may include a plurality of electrodes. For example, one LED may include two electrodes. In addition, the plurality of LEDs 10-1, 10-2, and 10-3 may be bonded to a plurality of conductive materials 60-1, 60-2, 60-3, 60-4, 60-5, and 60-6.

The plurality of color filters 20-1, 20-2, and 20-3 may be formed on an upper surface of each of the plurality of LEDs 10-1, 10-2, and 10-3. In this case, the plurality of color filters 20-1, 20-2, and 20-3 may be projected in a direction away from an upper surface of each of the plurality of LEDs 10-1, 10-2 and 10-3.

The plurality of color filters 20-1, 20-2, and 20-3 may correspond to each of the plurality of sub pixels. For example, the plurality of color filters 20-1, 20-2, and 20-3 may include a red (R) color filter corresponding to the R sub pixel, a green (G) color filter corresponding to the G sub pixel, and a blue (B) color filter corresponding to the B sub pixel. Here, the R color filter may only allow red light to pass through, the G color filter may only allow blue light to pass through, and the B color filter may only allow blue light to pass through. The color filter may be a narrow band color filter, and may increase a color purity with less optical loss. However, the example embodiments are not limited thereto, and a color filter of a different color, such as cyan magenta yellow key (CMYK), may be included.

When voltage is not applied to the plurality of LEDs 10-1, 10-2, and 10-3, each sub pixel should appear black, but they may appear bright due to the light incident from outside and being reflected.

The plurality of color filters 20-1, 20-2, and 20-3 may be configured to filter light incident from outside and being reflected to enable each sub pixel to appear black when voltage is not applied to the plurality of LEDs 10-1, 10-2, and 10-3. That is, when a color filter is not present, a color of a pixel may appear brighter than when a color filter is present.

The plurality of fluorescent bodies 30-1 and 30-2 may be of a light emitting material, which emits light, such as red light, green light, and blue light, by absorbing light of different wavelengths. The plurality of fluorescent bodies 30-1 and 30-2 may be, for example, an inorganic fluorescent body, an organic fluorescent body, or a Quantum Dot. For example, the inorganic fluorescent body may be a nitride-based fluorescent body such as a β-sialon fluorescent body (β-SiAlON: Eu 2+, etc.), a CASN system (CaAlSiN 3: Eu 2+ or the like), a SCASN system fluorescent body, a KSF system fluorescent body (K 2 SiF 6: Mn 4+Phosphorus), yttrium aluminum garnet (YAG) fluorescent body activated by cerium, lecithin aluminum garnet activated by cerium (LAG), nitrogen containing amino activated by at least one of europium and chromium (CaO—Al2O3-SiO$_2$)-based fluorescent body, and a silicate ((Sr, Ba) 2SiO4)-based fluorescent body activated by europium. Quantum dots may be nanoscale, highly dispersed particles such as II-VI, III-V, IV-VI semiconductors, specifically cadmium selenide (CdSe), CdSxSe1-x/ZnS or gallium phosphide (GaP) in core shell form.

The plurality of fluorescent bodies 30-1 and 30-2 may be formed on a lower surface of the plurality of color filters 20-1, 20-2, and 20-3 and an upper surface of the plurality of LEDs 10-1, 10-2, and 10-3. In this case, the plurality of fluorescent bodies 30-1 and 30-2 may be, for example, formed adjacent to the lower surface of the plurality of color filters 20-1, 20-2, and 20-3. In addition, the plurality of fluorescent bodies 30-1 and 30-2 may be formed apart from the upper portion of the plurality of LEDs 10-1, 10-2, and 10-3. In this case, a plurality of light leakage preventing films 50-1, 50-2, 50-3 and 50-4, may be formed to provide support such that the plurality of color filters 20-1, 20-2, and 20-3 and the plurality of fluorescent bodies 30-1 and 30-2 are spaced apart from the plurality of light emitting diodes 10-1, 10-2, and 10-3.

However, the example embodiments are not limited thereto, and the plurality of fluorescent bodies 30-1 and 30-2 may be formed adjacent to the upper surface of at least the portion of the plurality of LEDs 10-1, 10-2, and 10-3.

The plurality of fluorescent bodies 30-1 and 30-2 may be configured to divide a plurality of sub pixels. The plurality of fluorescent bodies 30-1 and 30-2 may convert light emitted from each of the plurality of LEDs 10-1, 10-2, and 10-3 to a wavelength of a sub pixel corresponding thereto, and may disperse the light having a converted wavelength through a dispersing agent and discharge it.

For example, the plurality of LEDs 10-1, 10-2, and 10-3 may emit blue light, and the emitted light may pass through the corresponding fluorescent body and may be converted to red light and green light. That is, a sub pixel including the plurality of fluorescent bodies 30-1 and 30-2 may operate as an R sub pixel and a G sub pixel, respectively. In addition, a sub pixel which does not include the plurality of fluorescent bodies 30-1 and 30-2 may operate as a B sub pixel.

For example, a light emitting diode may emit blue light, and thus, a fluorescent body may not be deposited on an upper surface of a light emitting diode corresponding to the B sub pixel, and the area above the light emitting diode may be left empty or filled with resins.

However, the example embodiments are not limited thereto, and the B sub pixel may include a fluorescent body. For example, a fluorescent body included in the B sub pixel may convert a wavelength of blue light incident from a light emitting diode to the fluorescent body to emit blue light having a wavelength required by a manufacturing specification of a display.

Accordingly to an example embodiment, an area of each of the plurality of fluorescent bodies 30-1 and 30-2 may be the same as an area of the corresponding color filter. However, the example embodiments are not limited thereto, and an area of each of the plurality of color filters 20-1, 20-2, and 20-3 may not be the same as that of each of the plurality of fluorescent bodies 30-1 and 30-2. However, the area of each of the plurality of color filters 20-1, 20-2, and 20-3 should be smaller than an area of each of the corresponding plurality of light emitting diodes 10-1, 10-2, and 10-3.

A glass layer 40 may be formed on an upper surface of the plurality of color filters 20-1, 20-2, and 20-3. The glass layer 40 may be formed on an upper surface of the plurality of light leakage preventing films 50-1, 50-2, 50-3, and 50-4, in addition to the plurality of color filters 20-1, 20-2, and 20-3, and may be configured to protect the plurality of color filters 20-1, 20-2, and 20-3 and the plurality of light leakage preventing films 50-1, 50-2, 50-3, and 50-4, etc. from the outside.

The glass layer 40 may be formed of any substance that may deposit the plurality of color filters 20-1, 20-2, and 20-3 and the plurality of light leakage preventing films 50-1, 50-2, 50-3, and 50-4. For example, the glass layer 40 may be a transparent plastic or a silicon wafer.

The plurality of light leakage preventing films 50-1, 50-2, 50-3, and 50-4 may be formed in a space between the plurality of color filters 20-1, 20-2, and 20-3 and on a lower surface of the glass layer 40. In particular, the plurality of light leakage preventing films 50-1, 50-2, 50-3, and 50-4 may be projected in a direction in which at least a partial area of the plurality of light leakage preventing films 50-1, 50-2, 50-3, and 50-4 is opposite to each of the plurality of LEDs 10-1, 10-2, and 10-3.

For example, the plurality of light leakage preventing films 50-1, 50-2, 50-3, and 50-4 may be formed such that a lower surface of a protruded area of the plurality of light leakage preventing films 50-1, 50-2, 50-3, and 50-4 is the same as or lower than a lower surface of the plurality of fluorescent bodies 30-1 and 30-2, and that a lower surface of the remaining (non-protruded) area of the plurality of light leakage preventing films 50-1, 50-2, 50-3, and 50-4 is higher than a lower surface of the fluorescent bodies 30-1 and 30-2.

One light leakage preventing film may include one protruded area, and each of the protruded area may be connected to one LED via a conductive material. In addition, a portion of the remaining (non-protruded) area of the light leakage preventing film may be connected to another LED via a conductive material.

However, the example embodiments are not limited thereto. One light leakage preventing film may have two or more protruded areas, and each of the two or more protruded areas may be connected to two or more LEDs.

A plurality of conductive materials 60-1, 60-2, 60-3, 60-4, 60-5, and 60-6 may be formed on a lower surface of a protruded area of the plurality of light leakage preventing films 50-1, 50-2, 50-3, and 50-4 and a lower surface of the non-protruded area. That is, the plurality of conductive materials 60-1, 60-2, 60-3, 60-4, 60-5, and 60-6 may include first conductive materials 60-1, 60-3 and 60-5 which are formed on a lower surface of a protruded area of the plurality of light leakage preventing films 50-1, 50-2, 50-3, and 50-4 and second conductive materials which are formed on a lower surface of the non-protruded area of the plurality of light leakage preventing films 50-1, 50-2, 50-3, and 50-4.

In addition, one light emitting diode may be connected to a pair of conductive materials. For example, each of the plurality of LEDs 10-1, 10-2, and 10-3 may include a first area which has a first thickness and a second area which has a second thickness that is thicker than the first thickness. In addition, each of the plurality of LEDs 10-1, 10-2, and 10-3 may include an electrode which is formed in the first area and an electrode which is formed in the second area, and may be provided with a voltage through the electrode formed in the first area and the electrode formed in the second area. Each of two conductive materials connected to one light emitting diode may be bonded to the electrode formed in the first area and the electrode formed in the second area.

For example, the electrode provided in the first area may be bonded to a bonding member which is provided in a protruded area of a light leakage preventing film. In addition, the electrode provided in the second area may be bonded to a bonding member which is provided in a partial area of the non-protruded area of the light leakage preventing film. A thickness of the light emitting diode in which the electrode of the first area is formed and the light emitting diode in which the electrode of the second area is formed may be different from each other.

A light emitting diode may include a first area and a second area with different heights, but the example embodiments are not limited thereto. For example, the entire area of the light emitting diode may be flat and have a uniform height. In addition, an edge area on one side of a light emitting diode may include a first electrode, and an opposite edge area to the first electrode of the light emitting diode may include a second electrode.

FIGS. 2A to 2D are diagrams illustrating example embodiments of the LED apparatus 1000 illustrated in FIG. 1. In FIGS. 2A to 2D, the elements shown in FIG. 1 will not be described in detail.

Figure 2A:
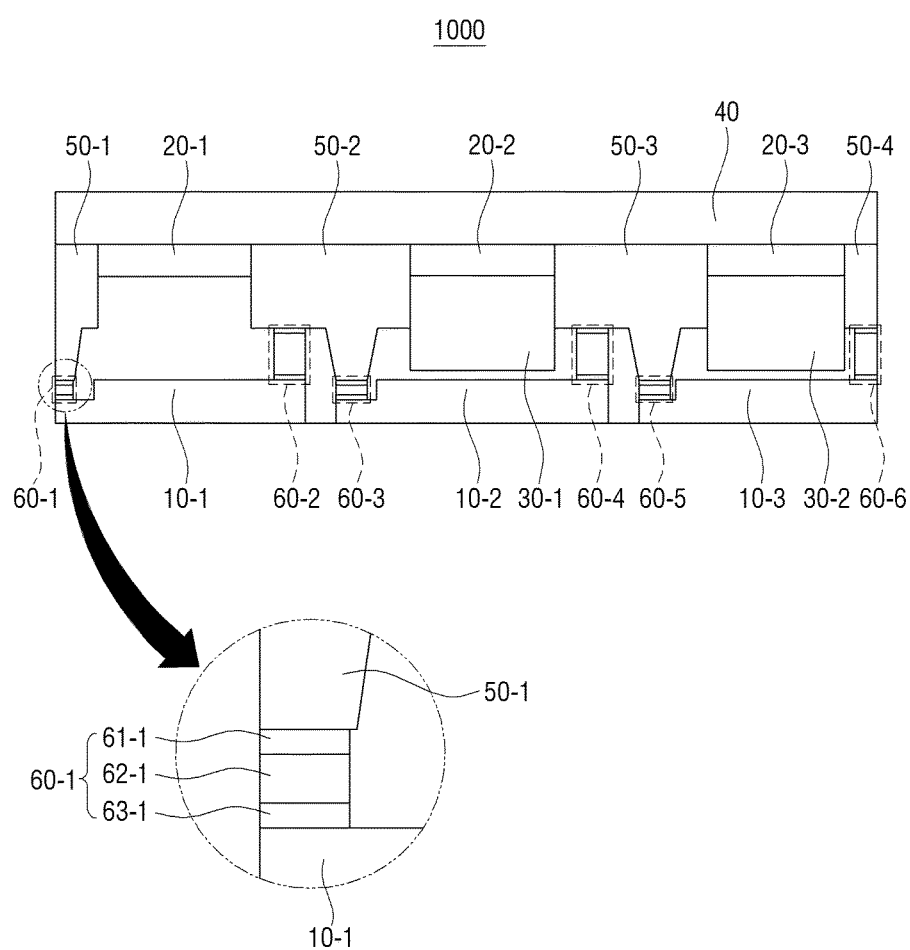
FIGS. 2A, 2B, 2C and 2D are diagrams illustrating example embodiments of the LED apparatus illustrated in FIG. 1.

FIG. 2A is a diagram illustrating a conductive material according to an example embodiment in the LED apparatus 1000 illustrated in FIG. 1.

As shown in FIG. 2A, the conductive material 60-1 may include a metal 61-1 which receives an external power, a bonding member 62-1 which is formed on a lower surface of each metal 61-1, and an electrode 63-1.

The metal 61-1 may include an indium tim oxide (ITO) which is formed on a lower surface of a protruded area of the light leakage preventing film 50-1. However, the example embodiments are not limited thereto, and the metal 61-1 may be formed of metal without ITO. The ITO is a transparent conductive film which is electroconductive, and is capable of reducing electric resistance.

The metal 61-1 may receive an external power and transmit the external power to the electrode 63-1 via the bonding member 62-1.

The bonding member 62-1 may be a substance for bonding the metal 61-1 and the electrode 63-1 at the time of manufacturing, and when a substance acting as the bonding member is deposited and heated, the substance may be hardened to bond the metal 61-1 and the electrode 63-1.

In addition, the bonding member 62-1 may be a conductive material, and may be used as a channel to transfer an external power applied through the metal 61-1 to the electrode 63-1.

The electrode 63-1 may receive an external power which is applied through the metal 61-1 and the bonding member 62-1, and apply voltage to the light emitting diode 10-1.

Here, the electrode 63-1 may be manufactured to be included in a partial area of the light emitting diode, and an LED apparatus 1000 may be manufactured by bonding an LED lower plate including two electrodes formed on the light emitting diode to an LED upper plate. In this case, one of the two electrodes may be bonded to the bonding member described above to bond the LED upper plate to the LED lower plate.

In FIG. 2A, the conductive material 60-1 on the leftmost side is described as an example, but the other conductive materials 60-2, 60-3, 60-4, 60-5, and 60-6 may be formed in the same way. The first conductive materials 60-1, 60-3, and 60-5 and the second conductive materials 60-2, 60-4, and 60-6 may have an identical in configuration apart from the length of the bonding member.

Figure 2B:
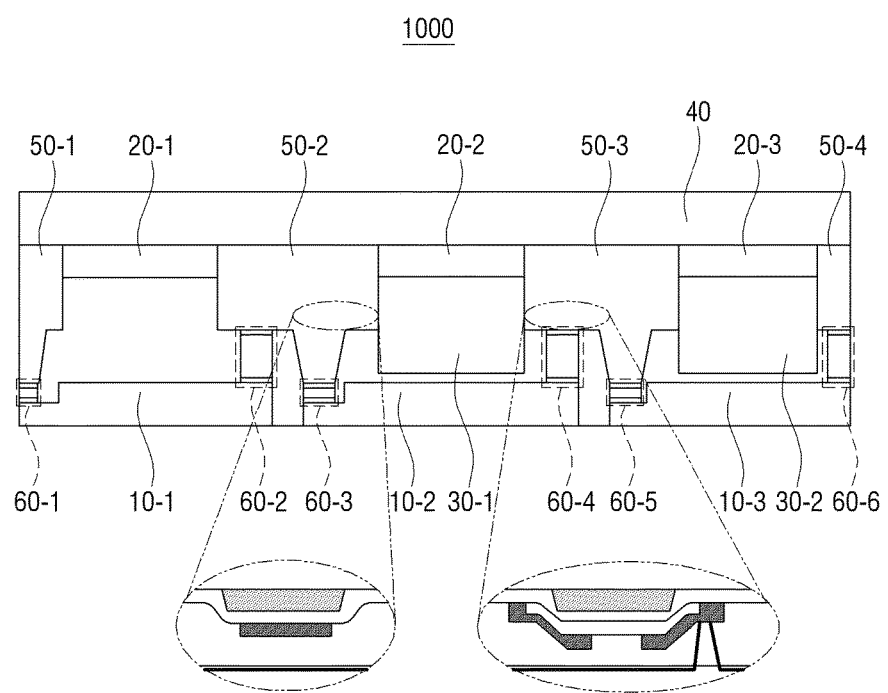

FIG. 2B is a diagram illustrating a position of a switching thin film transistor (TFT), according to an example embodiment.

As illustrated in FIG. 2B, each of a plurality of light leakage preventing films 50-1, 50-2, 50-3, and 50-4 may include a switching TFT therein. The switching TFT may be used to divide lines when a plurality of LED apparatuses 1000 are connected and included in a display device.

For example, the light emitting diode 10-2 may be operated under the control of the switching TFT illustrated in FIG. 2B. The light emitting diodes 10-1 and 10-3 may be operated similarly by switching TFTs.

Figure 2C:
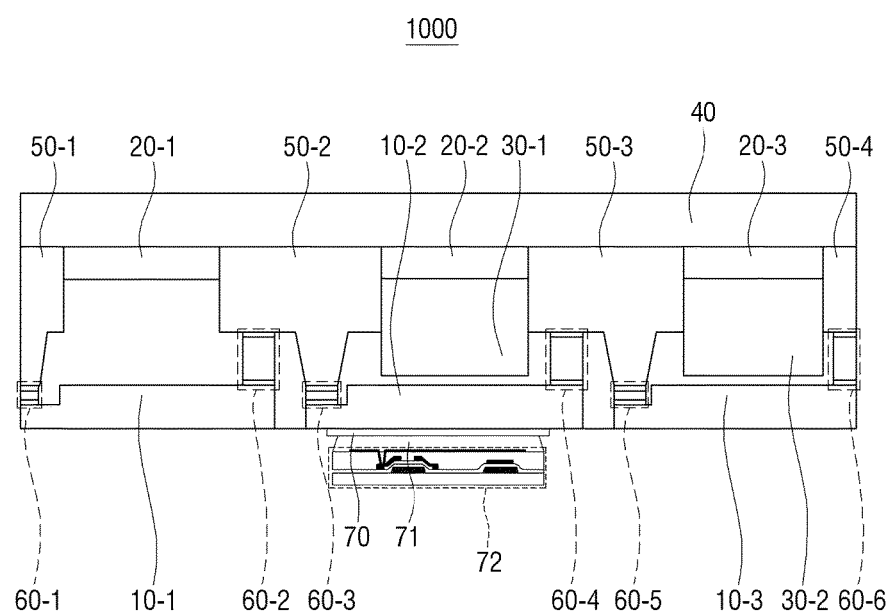

FIG. 2C is a diagram illustrating a position of a switching TFT, according to an example embodiment.

The LED apparatus 1000 may include a cathode electrode 70 and a switching TFT which are formed on a lower surface of the light emitting diode 10-2, and may further include a substrate 72 which is formed on a lower surface of the cathode electrode 70. In this case, a plurality of electrodes formed in the light emitting diodes 10-2 may be used as anode electrodes.

In addition, the LED apparatus 1000 may further include a solder ball bump & conductive adhesive layer 71 between the cathode electrode 70 and the substrate 72. Here, the solder ball bump & conductive adhesive layer 71 may be of a material for bonding the cathode electrode 70 and the substrate 72, and may be a conductive material.

In FIGS. 2B and 2C, the switching TFT illustrated may be similarly applied to the remaining light emitting diodes.

Figure 2D:
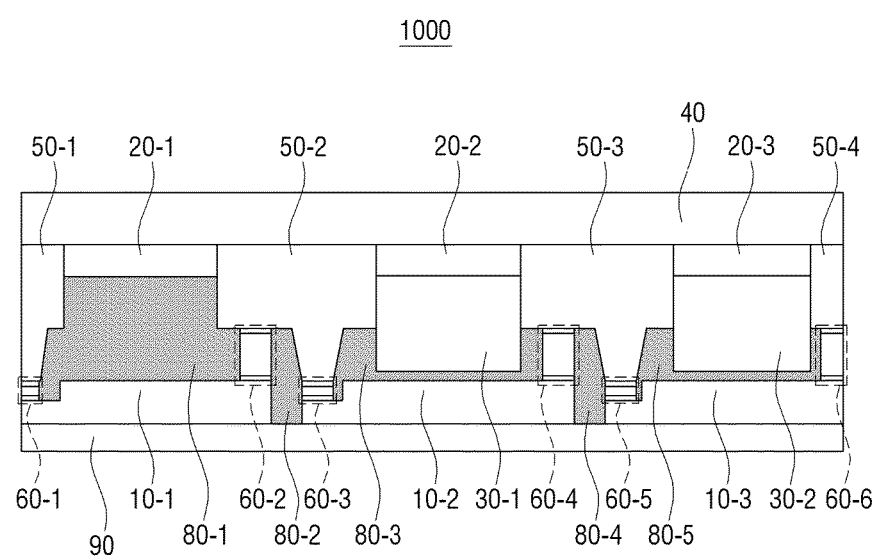

FIG. 2D is a diagram illustrating an LED apparatus 100, according to an example embodiment.

According to the structure of the LED apparatus 1000 described above, the LED apparatus 1000 may include empty spaces 80-1, 80-2, 80-3, 80-4, and 80-5, which may deteriorate the durability of the LED apparatus 1000. Accordingly, the empty spaces 80-1, 80-2, 80-3, 80-4, and 80-5 may be filled with resin. That is, an empty space enclosed by one of a color filter and fluorescent body included in each of a plurality of sub pixels, a light leakage preventing film, a conductive material, and a light emitting diode may be filled with resin to enhance the durability.

However, the example embodiments are not limited thereto. For example, the empty spaces 80-1, 80-2, 80-3, 80-4, and 80-5 of the LED apparatus 100 may be maintained empty, while a support substrate 90 may be formed on lower surfaces of the plurality of light emitting diodes 10-1, 10-2, and 10-3.

The empty spaces 80-1, 80-2, 80-3, 80-4, and 80-5 may, for example, be filled with resin, and the support substrate 90 may be formed on the lower surfaces of the plurality of light emitting diodes 10-1, 10-2 and 10-3.

In the LED apparatus 1000 having the structure as described above, a fluorescent body and a color filter may have a uniform thickness, and thus, quality of light being emitted may be improved.

A method for manufacturing the LED apparatus 1000 according to an example embodiment will be described below.

The terms "deposit" and "stack" which will be used below refer to forming a semiconductive material layer, and a layer or film which are formed though the various example embodiments may be deposited in a growing chamber by using a metal-organic chemical vapor deposition (MOCVD) method or a molecular beam epitaxy (MBE) method, and may be formed by means of depositing by various methods, such as a plasma-enhanced chemical vapor deposition (PECVD), atmospheric pressure chemical vapor deposition (APCVD), low pressure chemical vapor deposition (LP-CVD), ultra-high chemical vapor deposition (UHCVD), physical vapor deposition (PVD), an electronic beam method, a resistance heating method, and the like.

Figure 3:
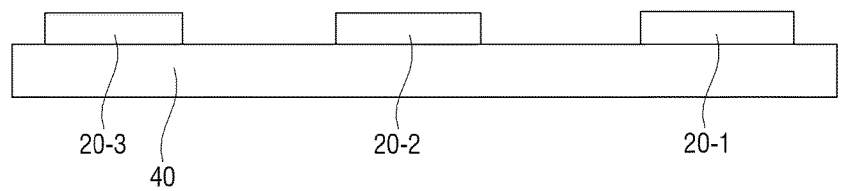
FIGS. 3, 4, 5 and 6 are diagrams illustrating a method for manufacturing an LED apparatus, according to an example embodiment.

Referring to FIG. 3, a plurality of color filters 20-1, 20-2, and 20-3, which respectively correspond to a plurality of sub pixels, are stacked on an upper surface of the glass layer 40. For example, a color filter layer may be formed on the upper surface of the glass layer 40, and a photoresistor may be applied to an upper surface of the color filter layer. Here, the photoresistor may be applied for use in exposure. In addition, a mask which is manufactured to correspond to a predetermined sub pixel may be disposed on an upper surface of the photoresistor. The mask manufactured to correspond to a predetermined sub pixel may be a mask for removing a photoresistor of an area that is not used as a sub pixel. That is, the mask may be manufactured such that a photoresistor of an area used as a sub pixel is blocked from an exposure apparatus. In addition, the mask may be of various shapes, and accordingly, a sub pixel area may be implemented in various shapes corresponding thereto.

Subsequently, when an exposed area of the photoresistor is exposed through an exposure apparatus and undergoes a development process, a photoresistor corresponding to an area to be used as a sub pixel may remain. That is, a lower area of an area from which the photoresistor is removed may be an area which is not used as a predetermined sub pixel, and a lower area of an area in which the photoresistor remains may be an area which is used as a predetermined sub pixel.

Subsequently, a color filter layer of the lower area of the area from which the photoresistor is removed is etched, and the remaining photoresistor is removed. As a result, one of the plurality of color filters 20-1, 20-2, and 20-3 may be formed. The plurality of color filters 20-1, 20-2, and 20-3 may be formed by repeating the above process two more times.

However, the example embodiments are not limited thereto, and a color filter may be formed in different ways. For example, any method for forming a color filter having a uniform thickness by etching the color filter may be used. In addition, the an organic film, an inorganic film (semiconductor material), or the like may be used to form the color filter.

Figure 4:
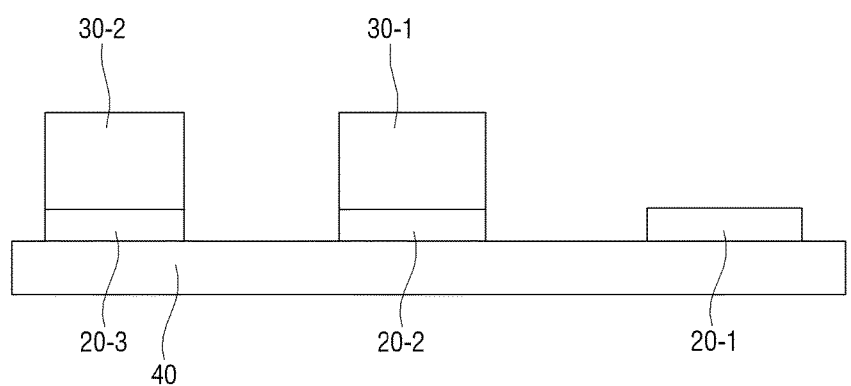

After the color filters are formed, as illustrated in FIG. 4, a fluorescent bodies 30-1 and 30-2 may be stacked on an upper surface of at least a portion of the plurality of color filters 20-1, 20-2 and 20-3. A method for stacking a fluorescent body may be identical or similar to a method for stacking a color filter. Here, the fluorescent bodies 30-1 and 30-2 may convert a plurality of lights which are emitted from each of the plurality of light emitting diodes 10-1, 10-2 and 10-3 to a wavelength of the corresponding sub pixels, and may diffuse the lights having a converted wavelength externally through a diffusion agent and discharge them.

The fluorescent bodies 30-1 and 30-2 which are stacked on an upper surface of at least a portion of the plurality of color filters 20-1, 20-2, and 20-3 may have the same area as the corresponding color filters.

According to an example embodiment, a method of simultaneously stacking and etching a color filter and a fluorescent body may be used. For example, a color filter layer may be formed on an upper surface of the glass layer 40, and a fluorescent body layer corresponding to an upper surface of the color filter layer may be formed, and then, a photoresistor may be applied. In addition, a mask which is manufactured to correspond to a predetermined sub pixel may be disposed on an upper surface of the photoresistor.

Subsequently, when an exposed area of the photoresistor is exposed through an exposure apparatus and undergoes a development process, a photoresistor corresponding to an area to be used as a sub pixel may remain. Subsequently, a color filter layer and fluorescent layer of a lower area of the area from which the photoresistor is removed is etched, and the remaining photoresistor is removed. As a result, one of the plurality of color filters 20-1, 20-2, and 20-3 and the corresponding fluorescent bodies 30-1 and 30-2 may be formed simultaneously. In addition, one of the plurality of color filters 20-1, 20-2, and 20-3 and the corresponding fluorescent bodies 30-1 and 30-2 may be formed of a same area.

Figure 5:
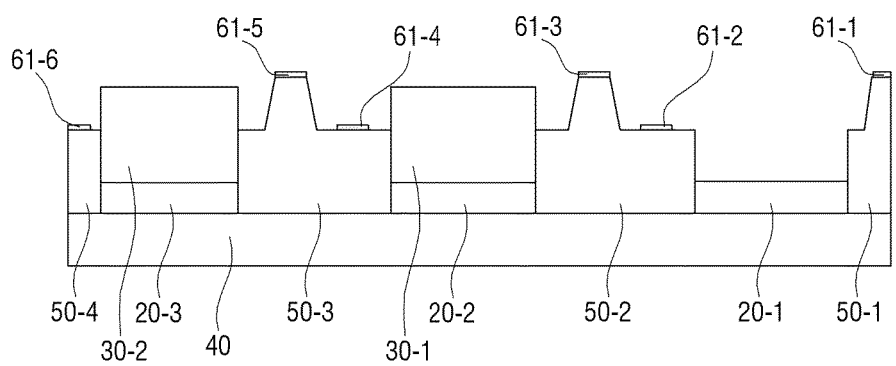

As illustrated in FIG. 5, the plurality of light leakage preventing films 50-1, 50-2, 50-3, and 50-4 may be formed in a space between the plurality of color filters 20-1, 20-2 and 20-3. For example, the plurality of light leakage preventing films 50-1, 50-2, 50-3 and 50-4 may be formed such that a portion of each of the plurality of light leakage preventing films 50-1, 50-2, 50-3, and 50-4 is projected in an upward direction.

For example, the plurality of light leakage preventing films 50-1, 50-2, 50-3, and 50-4 may be formed such that the height of the upper surfaces of protruded areas of the plurality of light leakage preventing films 50-1, 50-2, 50-3, and 50-4 are the same as or higher than upper surfaces of the fluorescent bodies 30-1 and 30-2, and that the height of the upper surfaces of the remaining (non-protruding) areas of the plurality of light leakage preventing films 50-1, 50-2, 50-3, and 50-4 are lower than that of the upper surfaces of the fluorescent bodies 30-1 and 30-2.

However, the example embodiments are not limited thereto, and the protruded areas of the plurality of light leakage preventing films 50-1, 50-2, 50-3, and 50-4 may be of any form as long as they may block light emitted from each of sub pixels.

A light leakage preventing film having a structure including a protruded portion as described above may be formed through double exposure. For example, a plurality of light leakage preventing films may be formed through the steps of, after forming a plurality of light leakage preventing films, etching the plurality of light leakage preventing films and forming a plurality of light leakage preventing films having a shape in which a predetermined area is protruded upward by etching the remaining area excluding the predetermined area of the plurality of light leakage preventing films to a second height which is lower than a first height. Here, a method of etching is similar to an exposing method using a photoresistor described above.

According to an example embodiment, each of the plurality of light leakage preventing films 50-1, 50-2, 50-3, and 50-4 may be formed to include a switching TFT therein.

After the plurality of light leakage preventing films 50-1, 50-2, 50-3, and 50-4 are formed, a plurality of conductive materials 60-1, 60-2, 60-3, 60-4, and 60-5 may be formed on an upper surface of each of the plurality of light leakage preventing films 50-1, 50-2, 50-3, and 50-4. FIG. 5 is a diagram illustrating a case in which a plurality of metals 61-1, 61-2, 61-3, 61-4, 61-5, and 61-6 which are included in a conductive material and are configured to receive an external power, are stacked on the upper surfaces of protruded areas of the plurality of light leakage preventing films 50-1, 50-2, 50-3, and 50-4 and portions of the non-protruded.

Figure 6:
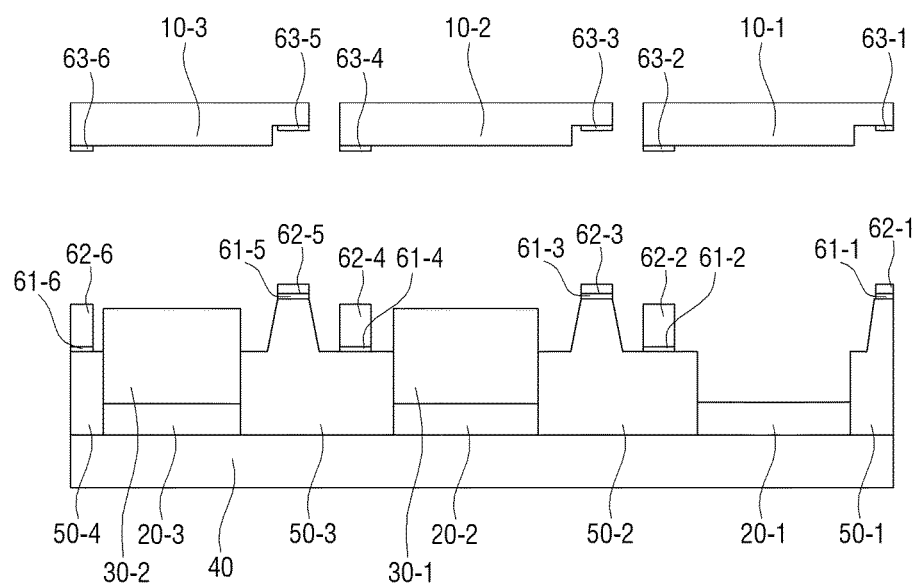

In addition, FIG. 6 is a diagram illustrating a case in which bonding members 62-1, 62-2, 62-3, 62-4, 62-5, and 62-6 are stacked on an upper surface of each of a plurality of metals 61-1, 61-2, 61-3, 61-4, 61-5, and 61-6, respectively.

FIG. 6 illustrates a lower plate of LED which includes a plurality of light emitting diodes 10-1, 10-2, and 10-3 corresponding to a plurality of sub pixels, respectively, and an upper plate of LED. The lower plate of LED may include a plurality of light emitting diodes 10-1, 10-2, and 10-3 and a plurality of electrodes 63-1, 63-2, 63-3, 63-4, 63-5, and 63-6 formed on each of the light emitting diodes.

However, the example embodiments are not limited thereto, and a plurality of light emitting diodes 10-1, 10-2, and 10-3 may be stacked on one substrate. For example, a lower plate of LED in which the plurality of light emitting diodes 10-1, 10-2, and 10-3 are formed may be bonded to an upper plate of LED including the glass layer 40 so that electrodes provided in each of the plurality of light emitting diodes 10-1, 10-2, and 10-3 face conductive materials 60-1, 60-2, 60-3, 60-4, 60-5, and 60-6. That is, an additional substrate may be used to facilitate bonding, and thereafter, the substrate may be removed.

According to an example embodiment, the plurality of light emitting diodes 10-1, 10-2, and 10-3 may form an electrode after forming a light emitting diode layer on the substrate, and may be formed by being divided into a plurality of light emitting diodes after the substrate has been removed. In FIG. 6, a p-type semiconductor layer and a n-type semiconductor layer are not distinguished; however, the two layers may be sequentially formed in the actual manufacturing process in any order.

According to an example embodiment, a light emitting diode layer including the plurality of light emitting diodes 10-, 10-2, and 10-3 may be formed by depositing a gallium nitride (GaN) layer on the substrate. Here, the light emitting diode layer may emit blue light. However, the example embodiments are not limited thereto, and the light emitting diode layer may be formed of any substance capable of forming the light emitting diode layer.

The respective light emitting diodes provided on the lower plate of LED may be divided in such a manner that an area of the respective light emitting diodes is larger than an area of the corresponding color filter.

Subsequently, an LED apparatus 1000 may be formed by bonding an upper plate of LED and a lower plate of LED. As described above, the lower plate of LED may include a plurality of electrodes 63-1, 63-2, 63-3, 63-4, 63-5, and 63-6 which are stacked on a portion of each of the plurality of light emitting diodes 10-1, 10-2, and 10-3, and may bond the upper plate of LED and the lower plate of LED by bonding each of the plurality of electrodes 63-1, 63-2, 63-3, 63-4, 63-5, and 63-6 to the corresponding bonding member 62-1, 62-2, 62-3, 62-4, 62-5, and 62-6 provided on the upper plate of LED.

In particular, each of the plurality of light emitting diodes 10-1, 10-2, and 10-3 may include a first area having a first thickness and a second area having a second thickness thicker than the first thickness. The upper plate of LED and the lower plate of LED may be bonded by bonding the electrodes 63-1, 63-3, and 63-5 provided in the first area of the plurality of light emitting diodes 10-1, 10-2, and 10-3 with the bonding members 62-1, 62-3, and 62-5 provided in protruded areas of the light leakage preventing films 50-1, 50-2, and 50-3 on the upper plate of LED.

According to an example embodiment, to manufacture the apparatus as illustrated in FIG. 2C, after bonding the upper plate of LED and the lower plate of LED as described above, a cathode electrode in an area corresponding to each of the plurality of light emitting diodes 10-1, 10-2, and 10-3 in a lower surface of the lower plate of LED, and bonding a substrate including a switching TFT is formed on the lower surface of the lower plate of LED. Here, the plurality of electrodes 63-1, 63-2, 63-3, 63-4, 63-5, and 63-6 may be anode electrodes.

According to an example embodiment, to manufacture the apparatus as shown in FIG. 2D, the upper plate of LED and the lower plate of LED may be bonded after filling an empty space of the upper plate of LED with, for example, resin, or a support substrate may be provided at a lower surface of the lower plate of LED after bonding the upper plate of LED and the lower plate of LED. However, the example embodiments are not limited thereto, and apparatus in FIG. 2D may be manufactured by filling the empty space of the upper plate of LED, bonding the upper plate of LED and the lower plate of LED after the filling, and providing a support substrate in the lower surface of LED after the bonding.

Figure 7:
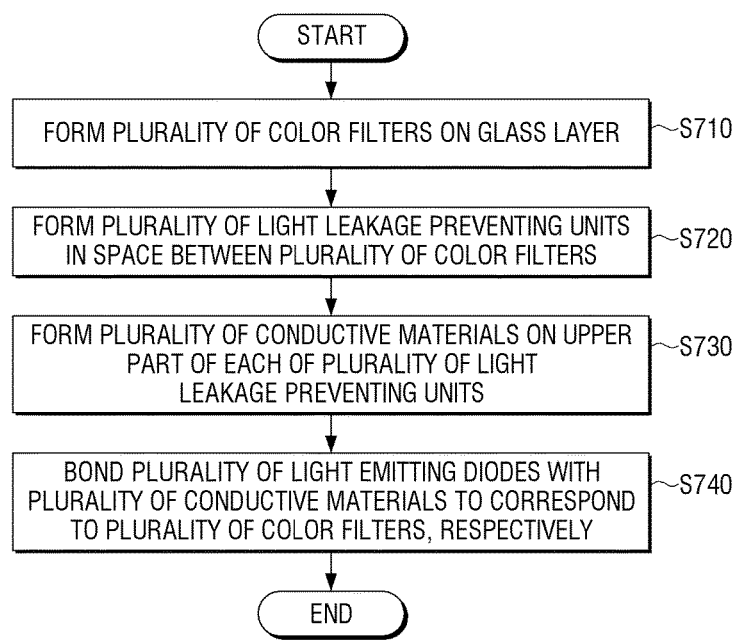
FIG. 7 is a flowchart illustrating a method for manufacturing an LED apparatus, according to an example embodiment.

FIG. 7 is a flowchart illustrating a method for manufacturing an LED apparatus according to an example embodiment.

First, a plurality of color filters are formed on a glass layer, at operation S710. Then, a plurality of light leakage preventing films are formed in a space between the plurality of color filters, at operation S720. Then, a plurality of conductive materials are formed on an upper surface of each of the plurality of light leakage preventing films, at operation S730. Then, a plurality of light emitting diodes are bonded to the plurality of conductive materials so that the plurality of light emitting diodes correspond to the plurality of color filters, respectively, at operation S740.

Here, the step of forming the plurality of light leakage preventing films S720, may include the steps of, after a plurality of light leakage preventing films are formed, etching the plurality of light leakage preventing films to a first height and forming a plurality of light leakage preventing films having a shape in which a predetermined area of the plurality of light leakage preventing films is protruded upward by etching the remaining areas excluding the predetermined area to a second height that is lower than the first height. In addition, the step of forming the plurality of conductive materials on an upper surface of each of the plurality of light leakage preventing films S730, may include the steps of forming a conductive material on upper surfaces of protruded areas from the plurality of light leakage preventing films and upper surfaces of a portion within the non-protruded area, and stacking a conductive bonding member on the conductive material.

Further, the step of bonding the plurality of light emitting diodes to the plurality of conductive materials to correspond to the plurality of color filters S740, may include bonding a lower plate of LED in which the plurality of light emitting diodes are formed and the upper plate of LED including a glass layer so that electrodes included in each of the plurality of light emitting diodes face the conductive materials.

The step of bonding the plurality of light emitting diodes to the plurality of conductive materials to correspond to the plurality of color filters S740, may include a bonding process so that electrodes provided in each of the plurality of light emitting diodes come in contact with the conductive materials, and the manufacturing method may further include the steps of, after bonding of the electrodes and the conductive material, forming a cathode electrode on an upper surface of each of the plurality of light emitting diodes and forming an additional substrate including a switching TFT on the cathode electrode. In addition, the electrodes included in each of the plurality of light emitting diodes may be anode electrodes.

In addition, the manufacturing method may further include the step of stacking fluorescent bodies on at least two color filters from among the plurality of color filters. The step of forming the plurality of light leakage preventing films S720, may include forming the plurality of light leakage preventing films such that the height of an upper surface of a protruded area of the plurality of light leakage preventing films may be identical to or higher than that of an upper surface of the fluorescent bodies, and that a height of an upper surface of a non-protruded area of the plurality of light leakage preventing films is lower than that of an upper surface of the fluorescent bodies.

In addition, each of the plurality of light emitting diodes may be divided into a first area and a second area that is thicker than the first area, and each of the first area and the second area may include an electrode. The step of bonding the plurality of light emitting diodes to the plurality of conductive materials to correspond to the plurality of color filters S740, may include bonding an electrode provided in the first area with a bonding member provided in protruded areas of the plurality of light leakage preventing films.

The step of bonding the plurality of light emitting diodes with the plurality of conductive materials to correspond to the plurality of color filters, respectively, may include the steps of, in a plurality of color filters, a plurality of light leakage preventing films, and a glass layer including a plurality of conductive materials, filling an empty space between configurations with, for example, resin, and bonding the plurality of light emitting diodes with the plurality of conductive materials.

In addition, the step of, after bonding the plurality of light emitting diodes with the plurality of conductive materials, providing a support substrate on an upper side of the plurality of light emitting diodes may be further included.

According to an example embodiment, an area of the fluorescent bodies may be identical to that of the corresponding color filters, and an area of each of the plurality of light emitting diodes may be larger than that of the corresponding color filters.

In addition, each of the plurality of light leakage preventing films may be include a switching TFT therein.

According to the exemplary embodiments, uniformity of the thickness of the fluorescent bodies of the LED device and the thickness of the color filter may be increased to improve the quality of the emitted light and the area of the fluorescent bodies and the color filters may be smaller than the area of the LED device to increase the resolution of the display device.

At least one of these components, elements, modules or units may use a direct circuit structure, such as a memory, a processor, a logic circuit, a look-up table, etc. that may execute the respective operations through controls of one or more microprocessors or other control apparatuses.

Example embodiments have been shown and described above, however, the present disclosure is not limited thereto, and modifications may be made by those skilled in the art without departing from the principles and technical spirit of the present disclosure, as defined by the appended claims, and their equivalents.

What is claimed is:

1. A method for manufacturing a light emitting diode (LED) apparatus, the method comprising:
   forming a plurality of color filters on a glass layer;
   forming a plurality of light leakage preventing films on the glass layer in a space between the plurality of color filters, the plurality of light leakage preventing films comprising a protruded area between the plurality of color filters;
   forming a plurality of conductive materials on a side of each of the plurality of light leakage preventing films opposite to the glass layer; and
   bonding a plurality of light emitting diodes with the plurality of conductive materials to correspond to the plurality of color filters, respectively.

2. The method of claim 1, wherein the forming the plurality of light leakage preventing films comprises:
   forming the plurality of light leakage preventing films on the glass layer;
   etching the plurality of light leakage preventing films to a first height; and
   etching a remaining area, excluding a predetermined area of the plurality of light leakage preventing films, to a second height shorter than the first height to form the protruded area of the plurality of light leakage preventing films in the predetermined area, and
   wherein the forming the plurality of conductive materials on each of the plurality of light leakage preventing films comprises:
   forming the plurality of conductive materials on a surface of an area in the protruded area and a surface of an area within a non-protruded area; and
   forming a plurality of conductive bonding members on each of the plurality of conductive materials.

3. The method of claim 2, wherein the bonding the plurality of light emitting diodes with the plurality of conductive materials to correspond to the plurality of color filters, respectively, comprises:
   bonding a first plate of the LED apparatus comprising the plurality of light emitting diodes comprising electrodes with a second plate of the LED apparatus comprising the glass layer,
   wherein the electrodes in each of the plurality of light emitting diodes are opposite to the plurality of conductive materials.

4. The method of claim 1, wherein the bonding the plurality of light emitting diodes with the plurality of conductive materials to correspond to the plurality of color filters, respectively, comprises:
   bonding electrodes in each of the plurality of light emitting diodes to be in contact with the plurality of conductive materials, respectively,
   wherein the method further comprises:
   after bonding the electrodes and the plurality of conductive materials, forming a cathode electrode on a surface of each of the plurality of light emitting diodes opposite to the electrodes; and
   forming a substrate comprising a switching thin film transistor (TFT) on the cathode electrode, and
   wherein the electrodes in each of the plurality of light emitting diodes is an anode electrode.

5. The method of claim 2, further comprising:
   forming a plurality of fluorescent bodies on at least two color filters from among the plurality of color filters,
   wherein the forming the plurality of light leakage preventing films comprises forming the first height to be equal to or higher than a height of the plurality of fluorescent bodies, and the second height to be shorter than the height of the plurality of fluorescent bodies.

6. The method of claim 2, wherein each of the plurality of light emitting diodes is divided into a first area and a second area that is thicker than the first area,
wherein the first area and the second area comprise an electrode, respectively, and
wherein the bonding the plurality of light emitting diodes with the plurality of conductive materials to correspond to the plurality of color filters, respectively, comprises bonding an electrode in the first area with a bonding member formed on the protruded area of the plurality of light leakage preventing films.

7. The method of claim 1, wherein the bonding the plurality of light emitting diodes with the plurality of conductive materials to correspond to the plurality of color filters, respectively, comprises:
filling an empty space between the plurality of color filters, the plurality of light leakage preventing films, and the glass layer with resin; and
bonding the plurality of light emitting diodes with the plurality of conductive materials.

8. The method of claim 1, further comprising:
after bonding the plurality of light emitting diodes with the plurality of conductive materials, disposing a support substrate on a side of the plurality of light emitting diodes opposite to the plurality of the conductive materials.

9. The method of claim 1, further comprising:
forming a plurality of fluorescent bodies on at least two color filters from among the plurality of color filters,
wherein an area of each of the plurality of fluorescent bodies is equal to an area of each of the plurality of color filters corresponding to each of the plurality of fluorescent bodies, and
wherein an area of each of the plurality of light emitting diodes is larger than an area of each of the plurality of color filters corresponding to each of the plurality of light emitting diodes.

10. The method of claim 1, wherein each of the plurality of light emitting diodes comprises a switching thin film transistor (TFT).

11. A light emitting diode (LED) apparatus comprising:
a glass layer;
a red (R) color filter, a green (G) color filter, and blue (B) color filter which are formed on the glass layer;
a plurality of light leakage preventing films formed on the glass layer, the plurality of light leakage preventing films comprising a protruded area between the R, G, and B color filters;
a plurality of conductive materials formed on a surface the plurality of light leakage preventing films opposite to the glass layer; and
a plurality of light emitting diodes which are bonded with the plurality of conductive materials on an opposite side of the plurality of light leakage preventing films, the plurality of light emitting diodes being formed to correspond to the R, G and B color filters.

12. The LED apparatus of claim 11, wherein the plurality of conductive materials comprise:
a plurality of metals configured to receive power; and
a plurality of bonding members are formed on each of the plurality of metals.

13. The LED apparatus of claim 12, wherein each of the plurality of light emitting diodes comprises a plurality of electrodes, and
wherein the plurality of electrodes are bonded with the plurality of bonding members.

14. The LED apparatus of claim 13, further comprising:
a plurality of cathode electrodes formed on a surface of each of the plurality of light emitting diodes opposite to the plurality of electrodes; and
a plurality of substrates which comprise a switching thin film transistor (TFT) formed on the plurality of cathode electrodes, respectively,
wherein each of the plurality of electrodes in each of the plurality of light emitting diodes is an anode electrode.

15. The LED apparatus of claim 12, further comprising a plurality of fluorescent bodies which are formed on the plurality of light emitting diodes corresponding to the R and G color filters,
wherein a height of the protruded area of each of the plurality of light leakage preventing films is equal to or longer than a height of the plurality of fluorescent bodies, and a height of a surface of a non-protruded area of the plurality of light leakage preventing films is shorter than the height of the plurality of fluorescent bodies.

16. The LED apparatus of claim 15, wherein each of the plurality of light emitting diodes is divided into a first area and a second area that is thicker than the first area,
wherein each of the first area and the second area comprise an electrode, and
wherein an electrode provided in the first area is bonded with a bonding member formed in the protruded area of each of the plurality of light leakage preventing films.

17. The LED apparatus of claim 11, further comprising at least one from among:
a resin filled in an empty space formed between the plurality of light leakage preventing films, and the glass layer including the plurality of conductive materials, and
a support substrate formed on the plurality of light emitting diodes on an opposite side of the plurality of conductive materials.

18. The LED apparatus of claim 11, further comprising a plurality of fluorescent bodies formed on light emitting diodes corresponding to the R color filter and the G color filter,
wherein an area of a fluorescent body is equal to an area of a color filter corresponding to the fluorescent body from among the R, G, and B color filters, and
wherein an area of each of the plurality of light emitting diodes is larger than an area of each of the R, G, and B color filters corresponding to each of the plurality of light emitting diodes.

19. The LED apparatus of claim 11, wherein each of the plurality of light emitting diodes comprises a switching thin film transistor (TFT).

20. The LED apparatus of claim 11, further comprising a plurality of fluorescent bodies formed on light emitting diodes corresponding to the R color filter and the G color filter,
wherein each of the plurality of fluorescent bodies are configured to convert light emitted from each of the plurality of light emitting diodes into a wavelength of a sub pixel corresponding to the plurality of light emitting diodes, to diffuse the light converted by a diffusing agent, and to emit the light converted.

* * * * *